United States Patent
Caletka et al.

[11] Patent Number: 6,138,893
[45] Date of Patent: Oct. 31, 2000

[54] METHOD FOR PRODUCING A RELIABLE BGA SOLDER JOINT INTERCONNECTION

[75] Inventors: David V. Caletka, Apalachin; Kevin Knadle; Charles G. Woychik, both of Vestal, all of N.Y.

[73] Assignee: International Business Machines Corporation, Armonk, N.Y.

[21] Appl. No.: 09/104,746

[22] Filed: Jun. 25, 1998

[51] Int. Cl.[7] .................................................. B23K 31/12
[52] U.S. Cl. ............................................ 228/102; 228/103
[58] Field of Search ................................. 228/102, 103, 228/180.5; 219/388, 391

[56] References Cited

U.S. PATENT DOCUMENTS

| | | | |
|---|---|---|---|
| 4,076,165 | 2/1978 | Latasiewicz et al. | 228/136 |
| 4,159,506 | 6/1979 | Latasiewicz et al. | 361/397 |
| 4,180,199 | 12/1979 | O'Rourke et al. | 228/102 |
| 4,224,744 | 9/1980 | Siegal et al. | 35/13 |
| 4,742,950 | 5/1988 | Neitz | 228/240 |
| 4,775,776 | 10/1988 | Rahn et al. | 219/388 |
| 4,909,430 | 3/1990 | Yokota | 228/102 |
| 4,938,410 | 7/1990 | Kondo | 228/180.1 |
| 5,180,440 | 1/1993 | Siegal et al. | 136/230 |
| 5,232,145 | 8/1993 | Alley et al. | 228/102 |
| 5,413,164 | 5/1995 | Teshima et al. | 165/11.1 |
| 5,433,368 | 7/1995 | Spigarelli | 228/8 |
| 5,435,482 | 7/1995 | Variot et al. | 228/254 |
| 5,439,160 | 8/1995 | Mercantonio | 228/102 |
| 5,562,243 | 10/1996 | Marcantonio | 228/8 |
| 5,573,688 | 11/1996 | Chanasyk et al. | 219/388 |
| 5,601,364 | 2/1997 | Ume | 374/57 |
| 5,629,578 | 5/1997 | Winzer et al. | 310/334 |
| 5,630,667 | 5/1997 | Ito | 374/57 |
| 5,647,667 | 7/1997 | Bast et al. | 374/57 |
| 5,767,424 | 6/1998 | Breunsbach et al. | 73/865.9 |
| 5,971,249 | 10/1999 | Berkin | 228/102 |

*Primary Examiner*—Patrick Ryan
*Assistant Examiner*—L. Edmondson
*Attorney, Agent, or Firm*—Scully, Scott, Murphy & Presser

[57] ABSTRACT

A method and an arrangement for measuring the cooling rate and thermal gradient between the top and bottom surfaces of a printed circuit board. Moreover, it is intended to facilitate control over the temperature gradient which is encountered between the top and bottom of the PCB so as to prevent warpage thereof during the formation of solder joints in a reflow solder oven.

18 Claims, 4 Drawing Sheets

METHOD FOR PRODUCING A RELIABLE BGA SOLDER JOINT INTERCONNECTION

BACKGROUND OF THE INVENTION

1. Field of the Invention

The present invention relates to a method and to an arrangement for measuring the cooling rate and thermal gradient between the top and bottom of a printed circuit board. Moreover, the invention is intended to facilitate control over the temperature gradient which is encountered between the top and bottom of the PCB so as to prevent warpage thereof during the formation of solder joints in a reflow solder oven.

In the implementation of soldering procedures, for example, in reflow soldering ovens, which are employed in the soldering of high-mass printed circuit boards, particularly when these PCBs are equipped with high-mass ceramic CCGA or CBGA modules, there have been ascertained unique types of solder failures which are encountered in the formation of solder joints for producing electrical interconnections, and which are frequently referred to as solidification stress fractures. There are three types of failure mechanisms that can result;

(a) Solidification fractures, time-zero fails or reliability exposure (any solder fillet).

(b) Stretched or disturbed joints, reliability exposure (any solder fillet).

(c) Brittle cracked columns, time-zero fails or reliability exposure (Solder column modules only).

These modes of soldering failure have been investigated in the technology, and shown to be highly dependent upon the cooling rate and thermal gradient extending through the thickness of the printed circuit board during corner solder joint solidification. An aspect which has been ascertained in cases of stress fracture failure has been the occurrence of a clean fracture which is produced between the intermetallic (Cu—Sn) material on the card pad and the solder material which is in the fillet. The result of the foregoing can be either an almost immediate time-zero (instantaneous) electrical open solder connection, or a latent reliability fail which necessitates cycling in order to become electrically open. The time-zero opens are characterized by gaps of up to 1 mil, which may occur on only a single solder joint which is surrounded by a large number of so-called stretched. solder joints. The reliability failures have been separated through less than 100% of the soldered area and do not evidence any measurable gap until failure early during temperature cycling.

In essence, when a thermocoupled profile card is conducted or conveyed, such as on a belt or conveyor, through a furnace; for instance, an infrared (IR)/convection oven which is known to produce stress fracture interconnections, there has been indicated the presence of a sharp transient thermal spike, when thermocouple data is collected and plotted/analyzed as prescribed herein. This particular temperature spike is believed to be responsible for inducing printed circuit board (PCB) warpage at a critical period in time when module solder joints; especially at a corner and periphery, are at the verge of solidification, thereby resulting in this type of failure mode on nearby joints that have solidified.

For example, in cases where a wire is soldered to a CCGA pad, and shortly after solidification, it has been ascertained that the solder joint strength is extremely low; for example, approaching only a few grams. Moreover, from modeling studies, there has been indicated a variation in card warpage, which may be on the order of 1 mil. Thus, when these experimental observations are combined, confirmation is had that this can readily result in an occurrence of stress fracture types of solder joint failure.

Another aspect of these particular solder failures which may not be readily apparent after assembly of the PCB components, resides in that the application of PCB deformation during solder joint solidification; in effect, warping of the PCB, can readily weaken any resulting electrical interconnection of the components.

As indicated, the process causing solder joint failure and related influencing factors are essentially as follows:

1. The temperature differential ($\Delta T_Z = T_{top} - T_{bot}$) which is created extending through the thickness of the PCB (the Z-axis) during the cooling segment of the conveyor belt or rail driven oven reflow cycle. The temperature on the upper surface of the printed circuit board can be significantly higher or lower than that on the bottom surface, depending on which surface cools more rapidly. One surface will cool faster than the other due to oven factors (forced air rate/volume/temperature, belt effects, etc.) and product attributes (component density and thermal mass). Thus, the magnitude of this Z-axis thermal differential ($\Delta T_Z$) is a function of (a) PCB thickness; inasmuch as thicker boards can support a larger temperature difference between the top or upper surface and the bottom surface.

(b) The mass, density and placement of components on the printed circuit board; whereby the greater mass and density retains more heat on the top side or upper surface in comparison with the bottom side or surface.

(c) Cool-down rate; wherein higher cooling rates exaggerate the instantaneous temperature differential between the top or upper and the bottom surfaces of the printed circuit board.

(d) The employment of direct impingement fans in order to cool the upper and/or lower PCB surfaces; whereby one surface is cooled significantly faster than the other (instantaneously or during the entire cool down period) due to differences in (1) Design and use of top versus bottom fans; staggered location of top/bottom fans, differences in airflow, and balanced use (some ovens have fans only on one side or the other).

(2) Design and use of oven belt or work board holder on which PCB is placed; can impede airflow more from one side than the other.

(3) Layout of components on PCB top and/or bottom surface, which can also impede airflow locally across PCB.

2. Differential thermal expansion between upper and lower board surfaces due to Z-axis temperature differential causes the printed circuit board to warp practically instantaneously, thereby imparting a load or stress on some of the solder joints.

In case of a positive $\Delta T_Z$ or change in the positive direction, the top side or upper surface of the printed circuit board expands at a greater rate than the bottom surface, causing the PCB to warp or bend concavely downwardly. In effect, below a module site, the PCB moves away from the component at corner and edge solder joints.

3. The instantaneous warping of the printed circuit board with respect to the modules or components which are positioned thereon creates a displacement and a resultant load which can readily produce a disturbed or fractured solder joint, depending upon the timing and the temperature of:

(a) The solder fillets; subject to solidification fractures or disturbed joints in critical temperature range 190° C.>T (temperature of the solder joint)>170° C.

(b) The solder columns (CCGA components); subject to brittle cracking in the critical temperature range 190° C.>T (temperature of the column)>180° C.

4. The result of the foregoing is a time-zero electrical opening of the joints (or columns), and/or early life cycle reliability failures.

Although considerations have been given in the technology towards improving the reliability of solder joints on printed circuit boards, and particularly in monitoring and possibly regulating encountered temperature differentials as the printed circuits boards are conveyed through infrared ovens or solder reflow ovens on conveyor belts, transport rails or the like, these generally do not readily provide for simple remedial methods measures and arrangements which enable correction of the temperature spike problems which are encountered during soldering sequences and which cause PCB warping and resultant solder joint failures.

2. Discussion of the Prior Art

Bast et al., U.S. Pat. No. 5,647,667 discloses an arrangement for the proof testing of ceramic parts. Utilized is an acceptance stress test in which a stress is generated by a temperature distribution on a part through thermal radiation. The stress is then characterized in order to validate the test. Although the temperature distribution is characterized similarly to the process employed in the present invention as between various component regions, there is no teaching of a method and algorithm for the profiling of a printed circuit board transported through a reflow solder oven in order to obtain results which will be indicative of any temperature spikes tending to warp a PCB and adversely affect the integrity of solder joints and electrical connects.

Ume, U.S. Pat. No. 5,601,364 discloses a method and apparatus for measuring thermal warpage including a test setup and apparatus for producing shadow moire measurements on printed circuit boards over a given time interval and temperature profile. The temperature profile obtained thereby is a highly simplified simulation of an actual reflow oven, such as is obtained from typical oven profile cards. Although, the patent evaluates printed circuit board warpage for a desired temperature profile over a period of time, there is no disclosure of positioning thermocouples in a unique manner on opposite surfaces of a printed circuit board for detecting specific failure mechanisms, nor is the thermal gradient ($\Delta T_Z$) through the PCB thickness ascertained.

Ito, U.S. Pat. No. 5,630,667 merely discloses a modeling method for predicting heat cracking through three-dimensional polymer model constituted of photo-set resins having a particular thermal conductivity in order to identify hot spots which may be susceptible to heat cracking; for example, such as exhaust manifolds.

Marcantonio, U.S. Pat. No. 5,562,243 discloses a method and apparatus for reflow temperature settings, in which an artificial network provides for the reflow oven settings for acceptable soldering of printed circuit boards based on inputted thermal/physical features and feedback learning. There is no disclosure of the utilization of thermocouples on opposite PCB surfaces for detecting specific failure mechanisms when measuring temperature at the upper and lower surfaces of the printed circuit board.

Similarly, O'Rourke, et al., U.S. Pat. No. 4,180,199 also merely describes a mass soldering system for measuring temperature as a function of time through a wave soldering process, and does not direct itself to a method and arrangement pursuant to the present invention.

SUMMARY OF THE INVENTION

Accordingly, pursuant to the present invention, in order to be able to utilize a thermal profile card representative of a PCB, which will measure the cooling rate and the Z-thermal gradient;

in effect, the localized temperature differential between the top and bottom of the card during a specific time interval while the module or component solder joint are solidifying, this is accomplished by providing a thermocouple at both the top and bottom surface of the PCB at all critical points on the profile card or printed circuit board, such as at the diagonal points of a module, middle of a module, leading edge of the card at three points, the trailing edge of the card at three points and the center line of the card at three points, between the leading and trailing edge.

A recommended profile has to ensure that there is an absence of a significant change in temperature differential ($\Delta T_Z$) of the thermocoupled sensing pairs or thermocouples during the critical cooling period when the PCB is conveyed through the cooling segment of the reflow solder oven, whereby there will be no encountered board warpage while the solidifying solder joints are susceptible to fracture.

For example, examples of acceptable limits for ($\Delta T_Z$) include, but are not limited to:

1. average magnitude of delta-T ($\Delta T_Z$) of all pairs of thermocouples is less about 0° C.–6° C.
2. No single magnitude of delta-$T_Z$ ($\Delta T_Z$) is greater than about 10° C.
3. No single change in the magnitude of delta-$T_Z$ ($\Delta t_Z$) is greater than about 10° C.

From experimental investigations, it has become known that the solidified solder joint strength is extremely weak at temperatures slightly below melting temperature. Based on the foregoing testing, a critical cooling period is defined as 190° C.>T(solder)>170° C. In view thereof, it is desired to eliminate any thermal spike which translates into a high Z-thermal gradient and therefore profile card or PCB warpage, within the range of 190° C. to 170° C.

Accordingly, it is an object of the present invention to provide an arrangement for the producing of reliable BGA solder joint interconnections.

It is another object of the present invention to provide a method of utilizing a thermal profile card which will measure the cooling rate and Z-thermal gradient delta-$T_Z$ ($\Delta T_Z$) between the top and bottom surfaces of a printed circuit board during the time interval while module corner joints are solidifying.

A more specific object of the present invention resides in providing an arrangement for measuring the cooling and Z-thermal gradient through the utilization of thermocoupling the upper surface and lower surface of a printed circuit board so as to be able to compensate for temperature variations in a reflow solder oven and to thereby be able to avoid temperature spikes.

BRIEF DESCRIPTION OF THE DRAWINGS

Reference may now be had to the following detailed description of a preferred embodiment of the invention, taken in conjunction with the accompanying drawings; in which.

BRIEF DESCRIPTION OF A PREFERRED EMBODIMENT

Figure 1:
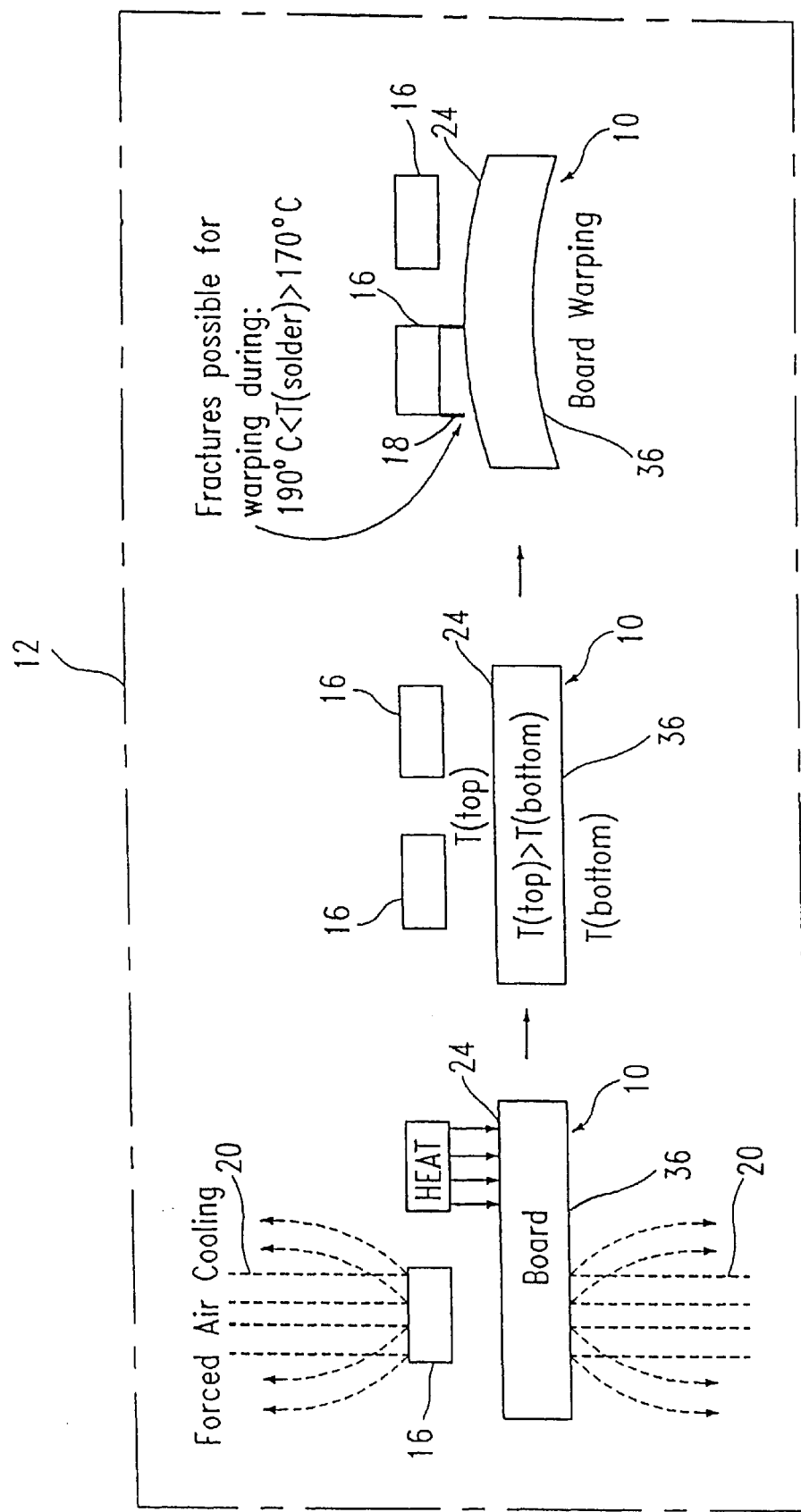
FIG. 1 illustrates, generally diagrammatically, the sequence of potential printed circuit board warpage encountered during a reflow soldering cycle in a soldering oven.

Reverting to FIG. 1 of the drawings there is diagrammatically illustrated a printed circuit board 10 which is subjected to heat in a reflow soldering oven 12 within which it is transported in a conveyor belt system or on a suitable conveyor rail (not shown). The printed circuit board 10 is shown with the upper surface 24 thereof equipped with different modules or components 16 such as; for example, ceramic (CCGA) or (CBGA) modules, which have solder connections 18 provided thereon.

As can be ascertained from the left hand end of the drawing FIG. 1, the printed circuit board 10 is in the cooling section of the oven 12 in which forced air cooling 20 is imposed on both upper and lower side of the PCB. As shown, the forced cooling air directed against the upper surface of the board 10 is to a considerable extent reflected away by the components 16, allowing a greater amount of heat to remain in the upper PCB surface. This represents only one factor. Differences in the volume/rate of airflow on the top and bottom PCB surfaces is the most significant factor.

Consequently, as indicated in the middle portion of FIG. 1, there is encountered a temperature differential ($\Delta T_Z$) between the upper surface of the PCB which support the component 16 and the bottom surface of the PCB. Resultingly, a higher temperature is present at the upper surface 24 of the printed circuit board 10 which, as shown in the right-hand portion of the drawing, causes the downward warping of the board, and thereby a potential fracture of at least some of the electrical solder joint interconnections 18 between the components 16 on the board, during the time interval when the temperature of the solder is less than 190° C. and higher than 170° C.

Figure 2:
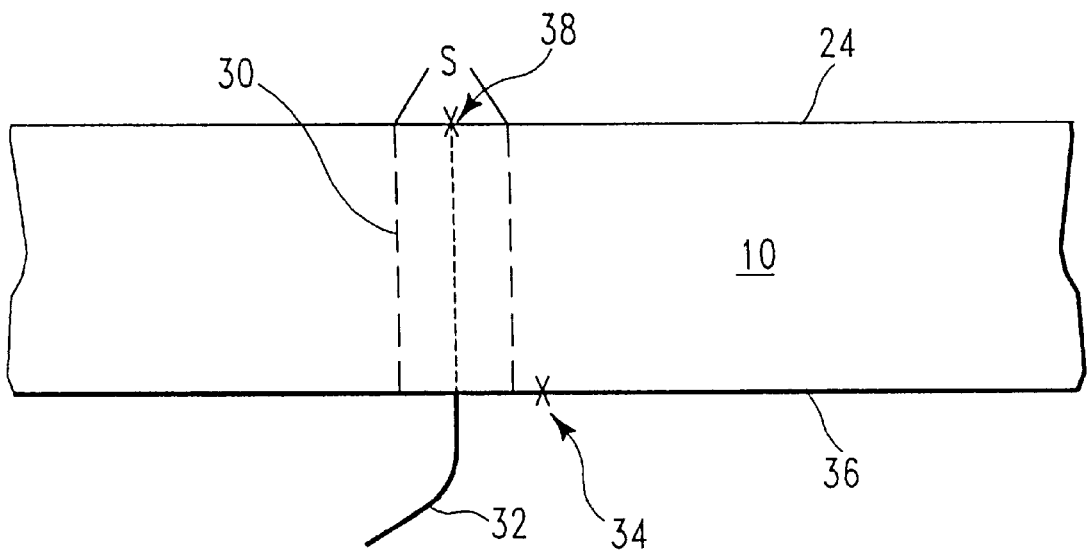
FIG. 2 illustrates diagrammatically a fragment of a printed circuit board or profile card illustrating the thermocoupling of the upper and lower surfaces thereof in order to obtain a thermal profile; analysis.

In order to ameliorate the foregoing problems by eliminating any thermal or temperature spikes which may be encountered during the critical cooling period of the solder which is in the range of from 190° C. to 170° C., as shown in FIG. 2 of the drawings, there is constructed a thermal profile card, which comprises a printed circuit board 10 fully assembled with components or modules 16, and with the addition of pairs of thermocouples 38 at a corner joint of the modules, located at the leading edge, trailing edge, and center of the upper and lower sides of the board. The pairs of thermocouples are preferably located at the following critical points of the module:

Diagonal points of module.
Middle of the module.
Leading edge of card 3 points.
Trailing edge of card 3 points.
Center line of card 3 points (between leading and trailing edge).

As shown in the drawing FIG. 2, for each point the printed circuit board 10 has a typical hole 30 drilled therethrough from the bottom to the top for the passage of a thermocouple wire 32. A thermocouple pair includes a thermocouple 34 placed at the bottom of the hole 30 measuring the temperature on the bottom surface 36 on the printed circuit board 10, and a further thermocouple 38 for measuring the temperature at the top surface 24 of the printed circuit board which correlates with the temperature of the solder, and is positioned at the hole so as to contact the solder while being secured to the upper surface 24 with an epoxy resin.

Similarly, the thermocouple 34 which is positioned at the lower end or in close proximity to the drilled hole 30 is secured to the bottom surface of the board with epoxy resin.

Thereafter, the temperatures of the upper and lower thermocouples are measured while conveyed through the reflow solder oven as a function of time.

The measured temperatures are calculated and plotted on the same graph as a function of time, whereby the temperature of the solder is equal to the temperature of the upper surface 24 of the printed circuit board 10 at the corner solder joints; whereas the temperatures of the upper surface minus the temperature of the bottom surface is defined as the top to bottom temperature gradient.

Figure 3:
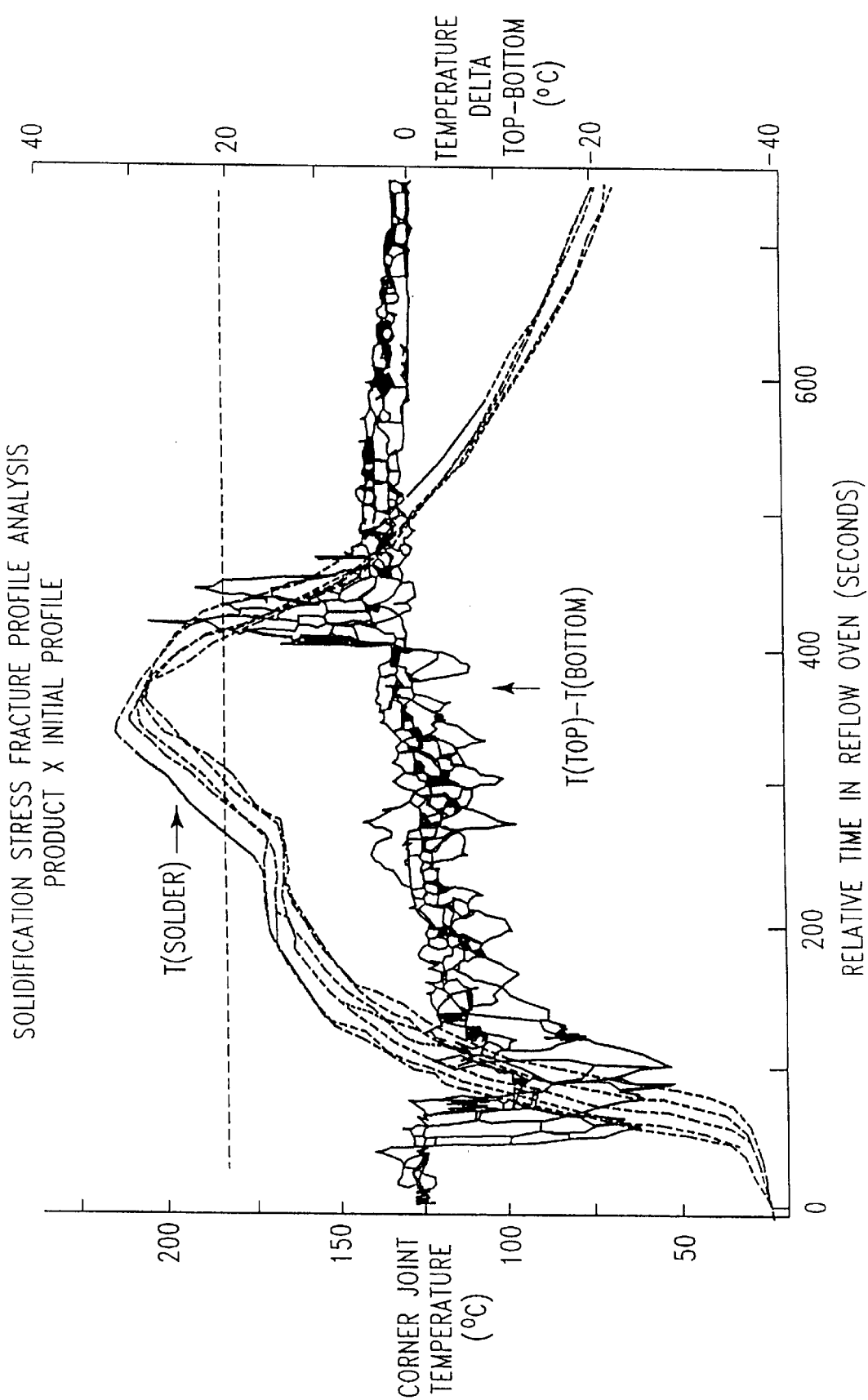
FIG. 3 illustrates a graphical representation of the thermal profile encountered during solidification stress fractures which will result in solder interconnect failures.

As shown in FIG. 3, the temperature differentials between the thermocouple pairs 34, 38 are evaluated with regard to susceptibility to solder fracture failure mode. Thus, a large and sudden positive increase in the temperature of the top or upper surface 24 relative to the bottom surface 36 during the cooling of the temperature of the solder within the range of 190° C. and 170° C. (defined as the critical cooling period) indicates a so called bad or temperature spike profile. This high differential temperature which can cause interconnect failures of the solder joints is clearly illustrated in FIG. 3.

In order to compensate for the foregoing, the oven temperature profile can be adjusted by one or more of the following steps:

(a) Reduce cooling rate in reflow solder oven, calculated as the slope temperature T(slope) of the solder over a period of time, (b) Reduce or eliminate impingement cooling fans, such as forced air cooling, especially at the bottom surface of the printed circuit board so as to maintain this bottom surface at a somewhat warmer temperature, thereby considerably reducing temperature differential ($\Delta T_Z$) with upper surface which could lead to critical connect failures at the solder joints. This is accomplished by controlling the temperature so as to reduce temperature differential ($\Delta T_Z$) within range of about 0° C. to about 10° C., and preferably closer to about 0° C.

(c) In lieu of eliminating impingement fans, balance top/bottom fans so cool down rate is identical (top vs. bottom) at each time (t) at any point (x,y) on PCB.

(d) Shielding the PCB bottom surface from direct cooling air impingement against any components or modules on the bottom of the PCB. This, again, will reduce any temperature differentials.

Figure 4:
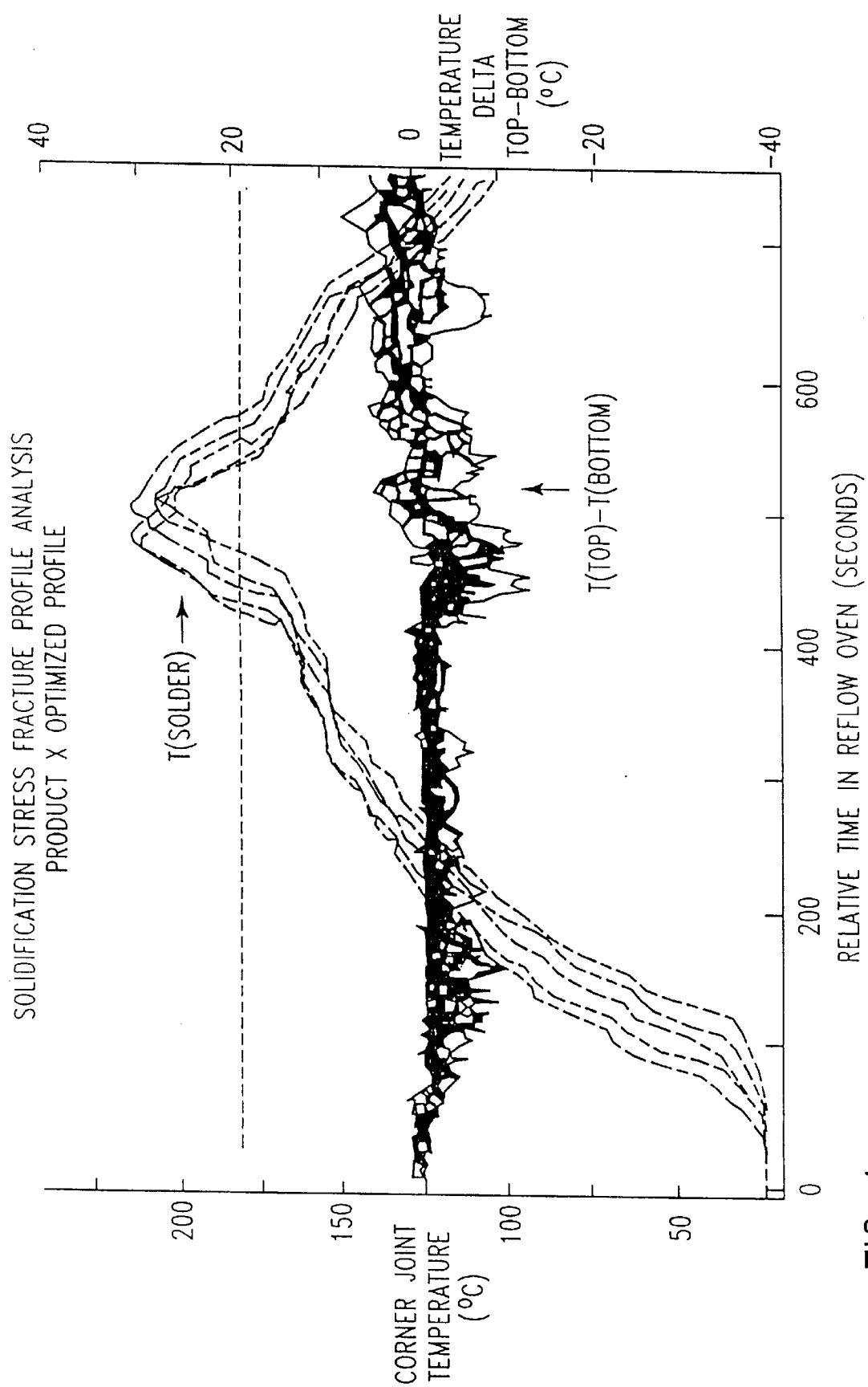
FIG. 4 illustrates a graphical representation similar to FIG. 3, illustrating an improved and optimized thermal profile obtained by the method of the present invention.

The foregoing steps of measuring the thermocouple temperatures through the conveyance within the reflow oven as a function of time, and calculating and plotting on the same graph, over a function of time, the temperature of the solder at the various corner joints and the temperature of the top surface 24 minus the temperature of the bottom surface 36, which is defined as the top to bottom temperature gradient can be repeated, and appropriate oven profile adjustments implemented until no significant top to bottom temperature gradient is in evidence during the PCB critical cooling period of the conveyance therethrough. This is clearly illustrated in the optimized temperature profile illustrated in FIG. 4 of the drawings, and which can be employed for the same product or printed circuit board as shown in FIG. 3 of the drawings.

From the foregoing, it becomes readily apparent that through the utilization of the paired thermocouples 34, 38 at the upper and lower surfaces 24, 36 of the printed circuit board 10, and through suitable control of reflow solder oven temperature conditions and the cooling of the solder joints, it is possible to avoid temperature spikes which could adversely affect the reliability of the solder joints, inasmuch as there is a significant reduction in any potential warpage of the printed circuit board.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. An arrangement for measuring the cooling rate and thermal gradient between an upper surface and a bottom surface of a printed circuit board during a time interval in which critically located solder joints of a module located on the upper surface of said printed circuit board are solidifying in a cooling section of a reflow solder oven; comprising:
   (a) a plurality of through-holes extending through said printed circuit board from the bottom surface to the top surface at least at spaced locations over the surface of on said printed circuit board;
   (b) a thermocouple wire extending through each said through-holes;
   (c) a first thermocouple being positioned on said upper surface proximate each said through-hole and connecting said thermocouple wire to said first thermocouple;
   (d) a second thermocouple being positioned on said bottom surface and connecting said thermocouple to said thermocouple wire; and
   (e) upper and lower pairs of said thermocouples being operative connected for measuring the temperature differential between said upper and bottom surfaces through the temperatures sensed by said first and second thermocouples at each respective said locations on said printed circuit board, each said first and second thermocouple pairs being located in specified identical upper and bottom surface locations on said printed circuit board and selective multiple locations to facilitate ascertaining and correcting of potentially damaging thermal gradients encountered between said upper and bottom surface; wherein said pairs of upper and lower thermocouples sense temperature differentials at a plurality of said critically located solder joints selectively defining diagonal points of the module, middle of the module, leading edge of the board at three points, trailing edge of board at three points, and the centerline of the board at three points between leading and trailing edge.

2. An arrangement as claimed in claim 1, wherein a plurality of said through-holes are formed in said printed circuit board at respective critically located solder joints for the module.

3. An arrangement as claimed in claim 1, wherein a plurality of said through-holes are formed in said printed circuit board at spaced of said locations over the surface of said printed circuit board.

4. An arrangement as claimed in claim 3, wherein said spaced locations having paired of said first and second thermocouples are arranged at exposed surface portions of said printed circuit board so as to facilitate obtaining globally dispersed temperature differential measurements.

5. An arrangement as claimed in claim 3, wherein upper and lower pairs of said thermocouples are operatively connected at respectively each of said through-holes for measuring the temperature differentials at said locations.

6. An arrangement as claimed in claim 5, wherein said pairs of upper and lower thermocouples sense temperature differentials at a plurality of said critically located solder joints selectively defining diagonal points of the module, middle of the module, leading edge of the board at three points, trailing edge of board at three points, and the centerline of the board at three points between leading and trailing edge.

7. An arrangement as claimed in claim 1, wherein said thermocouples are fastened to said upper and bottom surfaces with an epoxy resin.

8. An arrangement as claimed in claim 1, wherein the temperature of said cooling section of said reflow solder oven is controlled by the temperatures sensed by said thermocouples so as to maintain a temperature differential between the upper and lower surfaces of said printed circuit board within a predetermined temperature range.

9. An arrangement as claimed in claim 8, wherein the magnitude of the range of said temperature differential between the upper and bottom surfaces of said printed circuit board is maintained within about 0° C. to about 10° C. so as to prevent the occurrence of temperature gradient changes during said time interval in the cooling section of said reflow solder oven.

10. An arrangement as claimed in claim 9, wherein the critical cooling temperature in said reflow solder oven during said time interval is within the range of about 190° C. to 170° C.

11. An arrangement as claimed in claim 10, wherein the temperature of said reflow solder oven cooling section is adjusted by reducing the cooling rate of the solder of said solder joints.

12. An arrangement as claimed in claim 10, wherein said printed circuit board is cooled through a forced air impingement flow circulated by cooling fans.

13. An arrangement as claimed in claim 12, wherein said temperature differential range is maintained by reducing said impinging cooling air at least at the bottom surface of said printed circuit board.

14. An arrangement as claimed in claim 12, wherein said cooling fans are arranged above and below said printed circuit board, said fans being balanced so as to cool at the same rate.

15. An arrangement as claimed in claim 14, wherein said bottom surface is shielded against impingement from said cooling air circulation.

16. An arrangement as claimed in claim 15, wherein a work board holder is adapted to balance air flow between the top and bottom surfaces of said printed circuit board.

17. An arrangement as claimed in claim 1, wherein said printed circuit board comprises a temperature profile card.

18. An arrangement for measuring the cooling rate and thermal gradient between an upper surface and a bottom surface of a printed circuit board during a time interval in which critically located solder joints of a module located on the upper surface of said printed circuit board are solidifying in a cooling section of a reflow solder oven; comprising:
   (a) at least one through-hole extending through said printed circuit board from the bottom surface to the top surface at least at one location on said printed circuit board;

(b) a thermocouple wire extending through said at least one hole;

(c) a first thermocouple being positioned on said upper surface proximate said hole and connecting said thermocouple wire to said first thermocouple;

(d) a second thermocouple being positioned on said bottom surface and connecting said thermocouple to said thermocouple wire; and (e) means for measuring the temperature differential between said upper and bottom surfaces through the temperatures sensed by said first and second thermocouples at said at least one location on said printed circuit board, said first and second thermocouple being located in specified identical upper and bottom surface locations on said printed circuit board and selective multiple locations to facilitate ascertaining and correcting of potentially damaging thermal gradients encountered between said upper and bottom surface; and wherein the temperature of said cooling section of said reflow solder oven is controlled by the temperatures sensed by said thermocouples so as to maintain a temperature differential between the upper and lower surfaces of said printed circuit board within a predetermined temperature range.

* * * * *